(12) United States Patent
Metz et al.

(10) Patent No.: US 8,501,630 B2
(45) Date of Patent: Aug. 6, 2013

(54) SELECTIVE ETCH PROCESS FOR SILICON NITRIDE

(75) Inventors: Andrew W. Metz, Loundonville, NY (US); Hongyun Cottle, Guilderland, NY (US)

(73) Assignee: Tokyo Electron Limited, Tokyo (JP)

(*) Notice: Subject to any disclaimer, the term of this patent is extended or adjusted under 35 U.S.C. 154(b) by 272 days.

(21) Appl. No.: 12/892,912

(22) Filed: Sep. 28, 2010

(65) Prior Publication Data
US 2012/0077347 A1 Mar. 29, 2012

(51) Int. Cl.
*H01L 21/302* (2006.01)

(52) U.S. Cl.
USPC ........... 438/724; 438/710; 438/712; 438/714; 438/715; 216/67; 216/71; 216/72; 216/79; 257/E21.218

(58) Field of Classification Search
None
See application file for complete search history.

(56) References Cited

U.S. PATENT DOCUMENTS

| | | | |
|---|---|---|---|
| 4,529,476 A * | 7/1985 | Kawamoto et al. | 438/724 |
| 4,857,140 A * | 8/1989 | Loewenstein | 438/724 |
| 5,318,668 A | 6/1994 | Tamaki et al. | |
| 5,352,617 A | 10/1994 | Miwa | |
| 5,888,337 A | 3/1999 | Saito | |
| 6,093,627 A | 7/2000 | Sung | |
| 6,524,938 B1 | 2/2003 | Tao et al. | |
| 6,624,480 B2 | 9/2003 | Lin et al. | |
| 6,706,640 B1 * | 3/2004 | Tsai et al. | 438/740 |
| 6,805,139 B1 | 10/2004 | Savas et al. | |
| 6,842,658 B2 | 1/2005 | Izawa et al. | |
| 6,890,863 B1 | 5/2005 | Donohoe et al. | |
| 7,008,878 B2 | 3/2006 | Hsu et al. | |
| 7,288,482 B2 | 10/2007 | Panda et al. | |
| 7,393,788 B2 | 7/2008 | Cook | |
| 7,422,637 B2 | 9/2008 | Ku et al. | |
| 7,557,328 B2 | 7/2009 | Ohata | |
| 2002/0182880 A1 * | 12/2002 | Zhu et al. | 438/724 |
| 2004/0063328 A1 | 4/2004 | Wen et al. | |
| 2005/0009283 A1 | 1/2005 | Chiu et al. | |
| 2005/0136680 A1 | 6/2005 | Hsu et al. | |

(Continued)

FOREIGN PATENT DOCUMENTS

| | | |
|---|---|---|
| EP | 0908940 A2 | 4/1999 |
| GB | 2333268 A | 7/1999 |

(Continued)

OTHER PUBLICATIONS

Norström H. et al., RIE of SI02 in Doped and Undoped Fluorocarbon Plasmas, Vacuum, Pergamon Press, GB vol. 32, No. 12, pp. 737-745, Jan. 1, 1982.

(Continued)

*Primary Examiner* — Lan Vinh
*Assistant Examiner* — Jiong-Ping Lu
(74) *Attorney, Agent, or Firm* — Wood, Herron & Evans, LLP

(57) ABSTRACT

A method for selectively etching a substrate is described. The method includes preparing a substrate comprising a silicon nitride layer overlying a silicon-containing contact region, and patterning the silicon nitride layer to expose the silicon-containing contact region using a plasma etching process in a plasma etching system. The plasma etching process uses a process composition having as incipient ingredients a process gas containing C, H and F, and a non-oxygen-containing additive gas, wherein the non-oxygen-containing additive gas includes H, or C, or both H and C, and excludes a halogen atom.

9 Claims, 13 Drawing Sheets

U.S. PATENT DOCUMENTS

| | | |
|---|---|---|
| 2005/0164503 A1 | 7/2005 | Chan et al. |
| 2006/0016559 A1 | 1/2006 | Kobayashi et al. |
| 2006/0032585 A1 | 2/2006 | Kai et al. |
| 2006/0231522 A1 | 10/2006 | Pecora |
| 2007/0032081 A1 | 2/2007 | Chang et al. |
| 2007/0059938 A1 | 3/2007 | Kida et al. |
| 2007/0190792 A1 | 8/2007 | Cook |
| 2009/0032880 A1 | 2/2009 | Kawaguchi et al. |
| 2009/0155731 A1* | 6/2009 | Urakawa ................ 430/323 |

FOREIGN PATENT DOCUMENTS

| | | | |
|---|---|---|---|
| GB | 2333268 | * | 9/1999 |
| JP | 2000-286241 | * | 10/2000 |
| JP | 2000286241 A | | 10/2000 |
| WO | 2007040716 A2 | | 4/2007 |

OTHER PUBLICATIONS

European Patent Office, International Search Report and Written Opinion issued in corresponding International Application PCT/US2011/051379, dated Apr. 20, 2012, 11 pp.

U.S. Patent and Trademark Office, Non-final Office Action issued in related U.S. Appl. No. 12/826,488 dated Jan. 9, 2012, 18 pp.

* cited by examiner

SELECTIVE ETCH PROCESS FOR SILICON NITRIDE

CROSS REFERENCE TO RELATED APPLICATIONS

The present invention is related to U.S. patent application Ser. No. 11/226,452, entitled "METHOD AND SYSTEM FOR ETCHING SILICON OXIDE AND SILICON NITRIDE WITH HIGH SELECTIVITY RELATIVE TO SILICON", filed on Sep. 15, 2005, and now abandoned; U.S. patent application Ser. No. 11/350,765, entitled "METHOD AND SYSTEM FOR SELECTIVELY ETCHING A DIELECTRIC MATERIAL RELATIVE TO SILICON", filed on Feb. 10, 2006, and now issued as U.S. Pat. No. 7,393,788; and pending U.S. patent application Ser. No. 12/826,488, entitled "ETCH PROCESS FOR REDUCING SILICON RECESS", filed on Jun. 29, 2010; the entire contents of which are herein incorporated by reference.

BACKGROUND OF THE INVENTION

1. Field of Invention

The present invention relates to an etch process for selectively etching dielectric materials, and more particularly to an etch process for etching silicon nitride ($SiN_y$) with high selectivity relative to a silicon-containing contact region and/or silicon oxide ($SiO_x$).

2. Description of Related Art

Typically, during fabrication of integrated circuits (ICs), semiconductor production equipment utilize a (dry) plasma etch process to remove or etch material along fine lines or within vias or contacts patterned on a semiconductor substrate. The success of the plasma etch process requires that the etch chemistry includes chemical reactants suitable for selectively etching one material while substantially not etching another material.

For example, on a semiconductor substrate, a pattern formed in a protective layer can be transferred to an underlying layer of a selected material utilizing a plasma etching process. The protective layer can comprise a light-sensitive layer, such as a photoresist layer, having a pattern formed using a lithographic process.

Once the pattern is formed, the semiconductor substrate is disposed within a plasma processing chamber, and an etching chemistry is formed that selectively etches the underlying layer while minimally etching the protective layer. This etch chemistry is produced by introducing an ionizable, dissociative gas mixture having parent molecules comprising molecular constituents capable of reacting with the underlying layer while minimally reacting with the protective layer. The production of the etch chemistry comprises introduction of the gas mixture and formation of plasma when a portion of the gas species present are ionized following a collision with an energetic electron. Moreover, the heated electrons serve to dissociate some species of the gas mixture and create a reactive mixture of chemical constituents (of the parent molecules).

Thereafter, the ionized gas species and reactive mixture of chemical constituents facilitate the etching of various features (e.g., trenches, vias, contacts, etc.) in the exposed regions of substrate. Such substrate materials where etching is required include silicon oxide ($SiO_x$), silicon nitride ($SiN_y$), poly-crystalline silicon (polysilicon), and mono-crystalline silicon (silicon), and doped and un-doped silicon, for example.

SUMMARY OF THE INVENTION

The present invention relates to an etch process for selectively etching dielectric materials, and more particularly to an etch process for etching silicon nitride ($SiN_y$) with high selectivity relative to a silicon-containing contact region and/or silicon oxide ($SiO_x$).

According to one embodiment, a method for selectively etching a substrate is described. The method includes preparing a substrate comprising a silicon nitride layer overlying a silicon-containing contact region, and patterning the silicon nitride layer to expose the silicon-containing contact region using a plasma etching process in a plasma etching system. The plasma etching process uses a process composition having as incipient ingredients a process gas containing C, H and F, and a non-oxygen-containing additive gas, wherein the non-oxygen-containing additive gas includes H, or C, or both H and C, and excludes a halogen atom.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

In material processing methodologies, dry plasma etching utilizes a plasma chemistry having chemical reactants suitable for selectively etching one material while substantially not etching another material. In one example, a semiconductor device includes a layer of insulating (dielectric) material that is deposited over a gate structure and silicon-containing contact region, wherein a contact via is etched through the insulating material using a plasma etching process to expose the silicon-containing contact region.

Figure 1A:
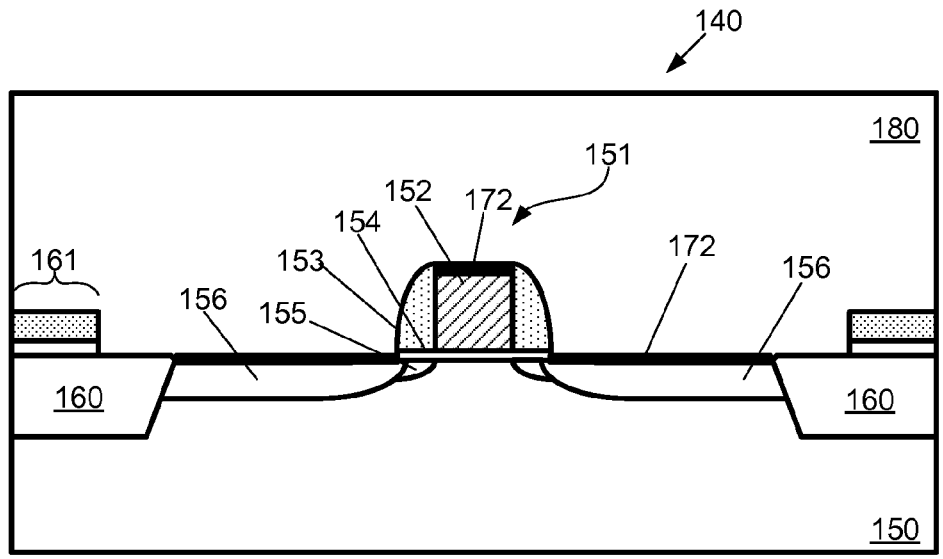
FIGS. 1A and 1B show a schematic representation of a semiconductor device.

As shown in FIG. 1A, the semiconductor device, generally referred to as substrate 140, comprises a silicon-containing substrate 150 having a gate structure 151 formed thereon and therein. The substrate 150 may comprise single crystal silicon, poly-crystalline silicon, silicon-germanium ($SiGe_x$), silicon-carbon ($SiC_y$), or silicon-germanium-carbon ($SiGe_xC_y$), or any combination of two or more thereof, and wherein x and y are greater than or equal to 0. The gate structure 151 includes a gate electrode 152, a gate insulation layer 154, and a gate spacer layer 153. The gate electrode 152 may include one or more layers including, for example, one or more metal layers, one or more metal barrier layers, one or more doped poly-crystalline silicon layers, and one or more cap layers. The gate insulation layer 154 may include, for example, a conventional gate dielectric, such as silicon dioxide ($SiO_2$), or a high dielectric constant (high-k) dielectric layer. The gate spacer layer 153 may be composed of one or more material layers, including, for example, silicon oxide ($SiO_2$, or $SiO_x$) and/or silicon nitride ($Si_3N_4$, or $SiN_y$).

Also shown in FIG. 1A, the gate structure 151 further includes lightly-doped regions 155 and source/drain regions 156 formed in a surface region of the silicon-containing substrate 150 using ion implant and/or GCIB (gas cluster ion beam) infusion processes. Isolation regions 160 having silicide blocking layers 161 may be formed adjacent the source/drain regions 156 to define the active region of substrate 150 therebetween.

Furthermore, as shown in FIG. 1A, a silicon-containing contact region 172 is formed at the source/drain regions 156. The silicon-containing contact region 172 may include doped silicon, metal silicide, or both doped silicon and metal silicide. Once the gate structure 151 and silicon-containing contact region 172 are formed, a dielectric layer 180 is deposited on substrate 140 to serve as inter-layer insulation. The dielectric layer 180 may, for example, include silicon nitride ($SiN_x$).

Figure 1B:
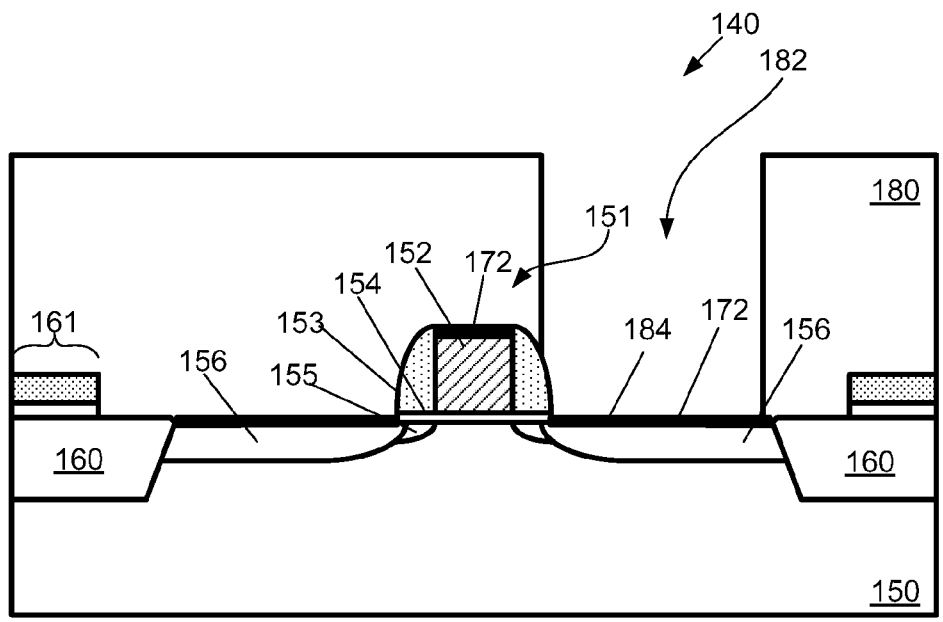

Thereafter, as shown in FIG. 1B, one or more contact vias 182 are prepared to expose the silicon-containing contact region 172 to form contact surfaces 184. As shown, the contact surface 184 may be the surface of the silicon-containing contact region 172 formed in the surface portion of source/drain region 156 of silicon-containing substrate 150. The one or more contact vias 182 may be formed using a contact etch process, such as a dry plasma etching process.

Thus, an etch chemistry is preferably chosen to etch the insulating material, i.e., dielectric layer 180, while minimally etching the underlying silicon-containing substrate 150 at the silicon-containing contact region 172, as well as minimally etching other structures containing silicon oxide ($SiO_x$) and poly-crystalline silicon (polysilicon). Furthermore, it is important for manufacturing yields, for example, that the results of the etching process are uniform across the extent of the substrate 140. As described above, the plasma etching process must perform according to rigid specifications to achieve properly dimensioned, robust electrical structures in the IC.

Figure 2:
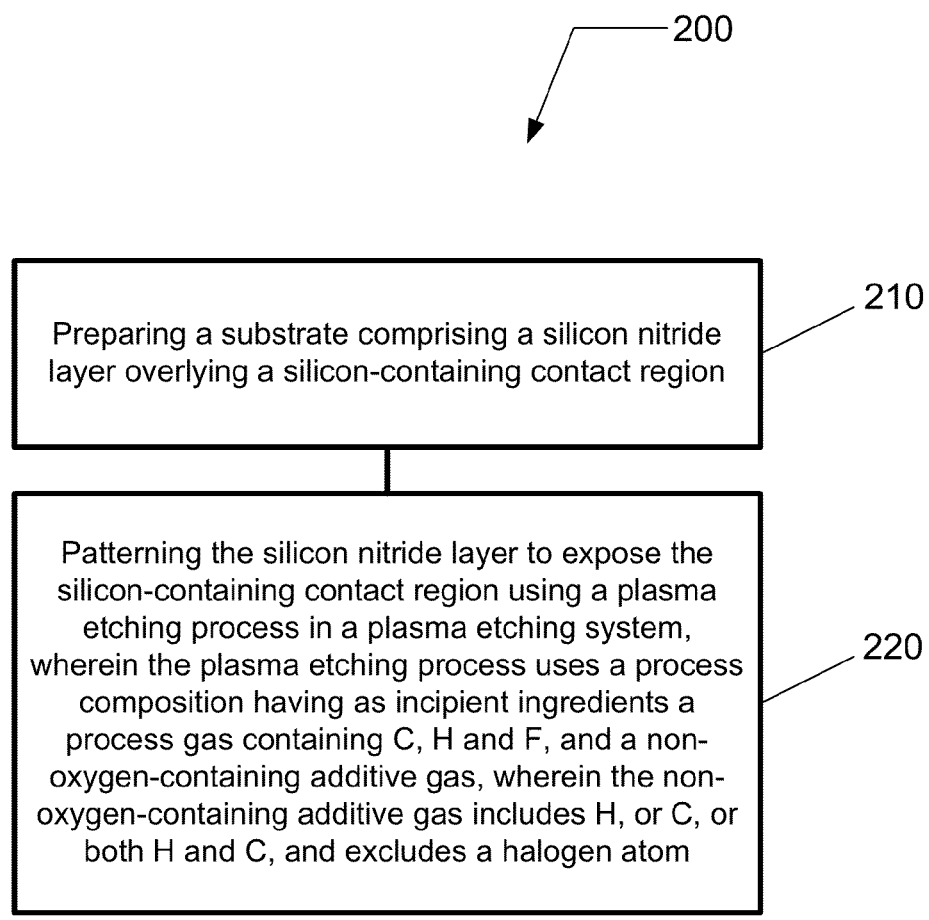
FIG. 2 provides a flow chart illustrating a method of selectively etching a substrate according to an embodiment.
Figure 3:
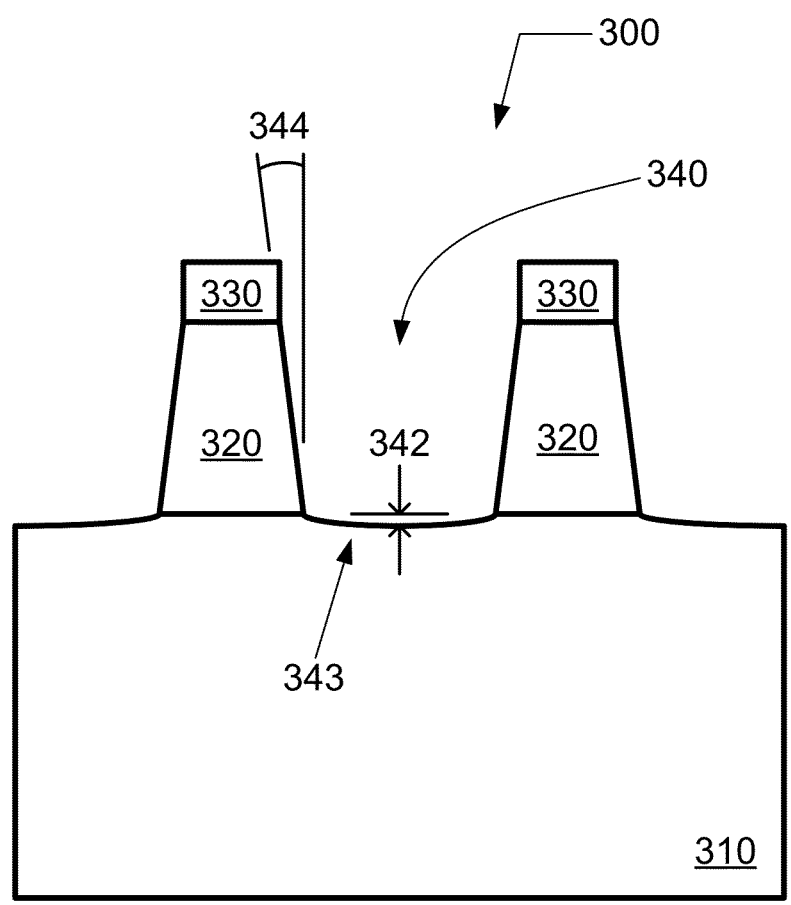
FIG. 3 provides a schematic illustration of a pattern formed in a layer on a substrate according to another embodiment.

Accordingly, in one embodiment a method and system for selectively and uniformly etching silicon nitride ($SiN_y$) with respect to silicon, polysilicon, and/or silicon oxide in a plasma etching system are described, wherein y is greater than 0. As illustrated in FIGS. 2 and 3, the method includes a flow chart 200 beginning in 210 with preparing a substrate 300 comprising a silicon-containing substrate 310, and a silicon nitride layer 320 overlying a silicon-containing contact region 343. The substrate 300 further comprises a patterned mask layer 330 having one or more layers (e.g., lithographic mask layer, soft mask layer, hard mask layer, anti-reflective coating (ARC), organic planarization layer (OPL), etc.).

In 220 and as shown in FIG. 3, a pattern 340 is transferred to the silicon nitride layer 320 to expose the silicon-containing contact region 343 using a plasma etching process in a plasma etching system. The plasma etching process uses a process composition having as incipient ingredients a process gas containing C, H and F, and a non-oxygen-containing additive gas, wherein the non-oxygen-containing additive gas includes H, or C, or both H and C, and excludes a halogen atom. Alternatively, the process composition consists of a process gas containing C, H and F, a non-oxygen-containing additive gas, and an optional noble gas, wherein the non-oxygen-containing additive gas includes H, or C, or both H and C, and excludes a halogen atom. The process gas may be oxygen-free.

As an example, the process gas containing C, H and F may include $CHF_3$, $CH_3F$, $CH_2F_2$, or any combination of two or more thereof. As another example, the process gas containing C, H and F may include $CH_3F$. As another example, the process gas containing C, H and F may consist of $CH_3F$. The process gas composition may further include a noble gas, such as He, Ne, Ar, Kr, or Xe.

The non-oxygen-containing additive gas may include a hydrocarbon gas (or more generally, a gas containing C and H, and represented by the formula $C_xH_y$, where x and y are integers greater than or equal to unity), $H_2$, or $NH_3$, or any combination of two or more thereof. For example, the non-oxygen-containing additive gas may include one or more gases selected from the group consisting of $H_2$, $CH_4$, $C_2H_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, and $C_6H_{12}$.

In one embodiment, the process composition contains as incipient ingredients $CH_3F$ and $H_2$. Alternatively, the process composition consists of incipient ingredients $CH_3F$, $H_2$, and an optional noble gas. Therein, the method of selectively etching silicon nitride ($SiN_y$), wherein y is greater than 0, with respect to silicon, polysilicon, and/or silicon oxide may include optimizing the plasma etching process to achieve an etch selectivity between the silicon nitride layer 320 and the silicon-containing contact region 343 that exceeds 40:1. Furthermore, the method may include preparing the substrate 300 with a silicon oxide layer, and optimizing the plasma etching process to achieve an etch selectivity between the silicon nitride layer 320 and the silicon oxide layer that exceeds 8:1.

In another embodiment, the process composition contains as incipient ingredients $CH_3F$ and $C_2H_4$. Alternatively, the process composition consists of incipient ingredients $CH_3F$, $C_2H_4$, and an optional noble gas. Therein, the method of selectively etching silicon nitride ($SiN_y$), wherein y is greater than 0, with respect to silicon, polysilicon, and/or silicon oxide may include optimizing the plasma etching process to achieve an etch selectivity between the silicon nitride layer 320 and the silicon-containing contact region 343 that exceeds 20:1. Furthermore, the method may include preparing the substrate 300 with a silicon oxide layer, and optimizing the plasma etching process to achieve an etch selectivity between the silicon nitride layer 320 and the silicon oxide layer that exceeds 20:1.

As shown in FIG. 3, an amount of the process gas containing C, H and F and/or an amount of the non-oxygen-containing additive gas in the plasma etching process is selected to achieve: (1) a silicon recess 342 formed in the silicon-containing contact region 343 having a depth less than 10 nanometers (nm), and/or (2) a sidewall profile in the pattern 340 having an angular deviation 344 from 90 degrees less than 5 degrees. Alternatively, the silicon recess 342 formed in the silicon-containing contact region has a depth less than 5 nanometers (nm), and/or the angular deviation 344 from 90 degrees is less than 2 degrees. Alternatively, the silicon recess 342 formed in the silicon-containing contact region has a depth less than 2 nanometers (nm), and/or the angular deviation 344 from 90 degrees is less than 1 degree.

As described above, the process gas composition comprises use of a gas collectively containing C, H and F, or fluorohydrocarbons, such as $CH_3F$, $CH_2F_2$, and $CHF_3$. High etch selectivity and acceptable uniformity can be achieved by selecting a process condition, including a pressure, a flow rate of $CH_3F$, and a radio frequency (RF) power coupled to the plasma etching system, such that a proper balance of active etching molecules or atoms, and polymer forming molecules are formed within the etching plasma.

For example, it is believed by the inventors that the use of an etch chemistry collectively containing C, H and F with a non-oxygen-containing additive gas promotes the formation of hydrocarbon and fluorocarbon molecules in the presence of the etching plasma that may adsorb on silicon oxide, polysilicon, and silicon surfaces and protect these surfaces during the etching process, while permitting the etching of silicon nitride surfaces. An etch chemistry collectively containing C, H and F may produce a balance of actively etching molecules and polymer forming molecules. The use of an oxygen-free etch chemistry may prevent damage and/or oxidation of the exposed silicon-containing contact region 343.

To achieve the aforementioned etch performance metrics, including reduced silicon recess, a flow rate of the process gas containing C, H and F may be selected to range from about 1 sccm (standard cubic centimeters per minute) to about 50 sccm, and a flow rate of the non-oxygen-containing additive gas may be selected to range from about 80 sccm to about 120 sccm for $H_2$, and range from about 5 sccm to about 20 sccm for $C_2H_4$. The pressure in the plasma etching system is selected to range from 1 mTorr (milli-Torr) to 200 mTorr, e.g., 10 mTorr to 80 mTorr, or 30 mTorr to 60 mTorr.

As will be described in greater detail below, the substrate temperature may be controlled according to a temperature control scheme using a temperature controlled substrate holder in the plasma etching system. Using the temperature controlled substrate holder in the plasma etching system, the substrate temperature may be spatially and temporally controlled to improve the plasma etch process.

The temperature controlled substrate holder may comprise a support base having fluid channels to circulate a temperature controlled thermal fluid in the support base, and a substrate support coupled via a thermal insulator to an upper portion of the support base. The substrate support further comprises one or more heating elements embedded within the substrate support, an upper surface to support the substrate by contact between the upper surface and a backside of the substrate, and an electrostatic clamp electrode to hold the substrate on the upper surface of the substrate support. The one or more heating elements may comprise a first heating element located at a substantially central region of the substrate and a second heating element located at a substantially edge region of the substrate, wherein the first heating element and the second heating element are concentrically arranged.

Additionally, the temperature controlled substrate holder may include a backside gas supply system configured to supply a heat transfer gas to the backside of the substrate through at least one of a plurality of orifices or channels disposed on the upper surface of the substrate support. The orifices of the backside gas supply system may be arranged in a plurality of zones on the upper surface of the substrate support to vary a backside pressure in a radial direction between a substantially central region of the backside of the substrate and a substantially edge region of the backside of the substrate. For example, the plurality of zones for controlling the supply of heat transfer gas to the backside of the substrate may correspond to the regions where the first and second heating elements are located.

The process pressure may be varied during the plasma etch process. Additionally, during the plasma etch process, power for generating plasma may be varied, or it may be kept constant. Furthermore, the plasma etch process may proceed for a time duration sufficient to etch partially or fully through the silicon nitride layer 320 in the film stack. The time duration may be determined in-situ using endpoint detection or it may be determined prior to performing each plasma etch process. To address etch uniformity, etch profile control, and/or critical dimension (CD) control, the duration of the plasma etch process may be extended by an over-etch process.

The plasma etch process described above may be performed utilizing a plasma etching system such as the one described in FIGS. 4 through 11. Furthermore, the plasma etch process described above may be performed utilizing a temperature controlled substrate holder in a plasma etching system such as the one described in FIG. 12.

Figure 4:
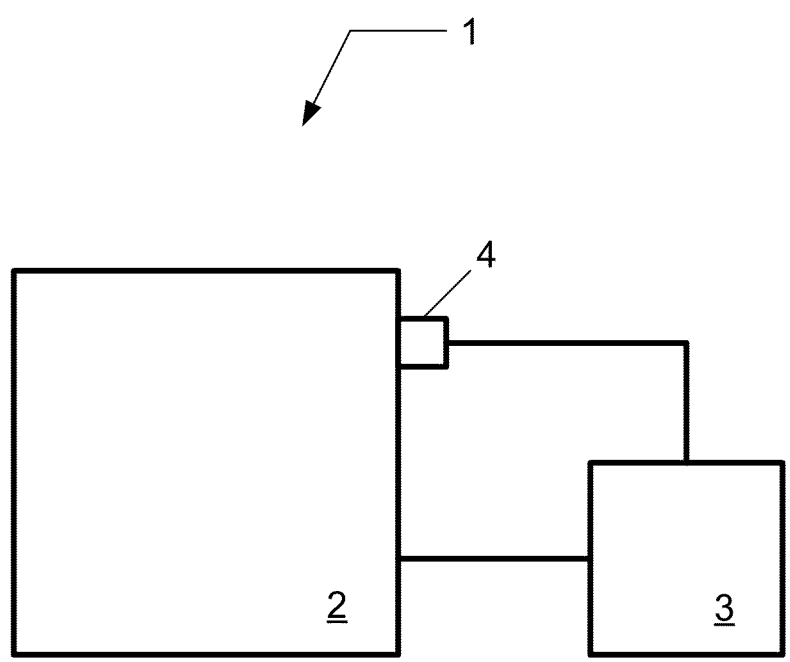
FIG. 4 shows a schematic representation of a plasma etching system according to an embodiment.

According to one embodiment, a plasma etching system 1 is depicted in FIG. 4 comprising a plasma processing chamber 2, a diagnostic system 3 coupled to the plasma processing chamber 2, and a controller 4 coupled to the diagnostic system 3 and the plasma processing chamber 2.

The controller 4 is configured to execute a process recipe comprising a process gas composition having as incipient ingredients a process gas containing C, H and F, and a non-oxygen-containing additive gas to selectively and uniformly etch silicon nitride relative to silicon oxide, silicon and/or polysilicon, wherein the non-oxygen-containing additive gas includes H, or C, or both H and C, and excludes a halogen atom. Alternatively, the controller 4 is configured to execute a process recipe comprising methyl fluoride ($CH_3F$), and $H_2$ or a hydrocarbon gas to selectively etch silicon nitride relative to silicon oxide, silicon and/or polysilicon. Additionally, controller 4 is configured to receive at least one endpoint signal from the diagnostic system 3 and to post-process the at least one endpoint signal in order to accurately determine an endpoint for the plasma etch process. In the illustrated embodiment, plasma etching system 1, depicted in FIG. 4, utilizes plasma for material processing.

Figure 5:
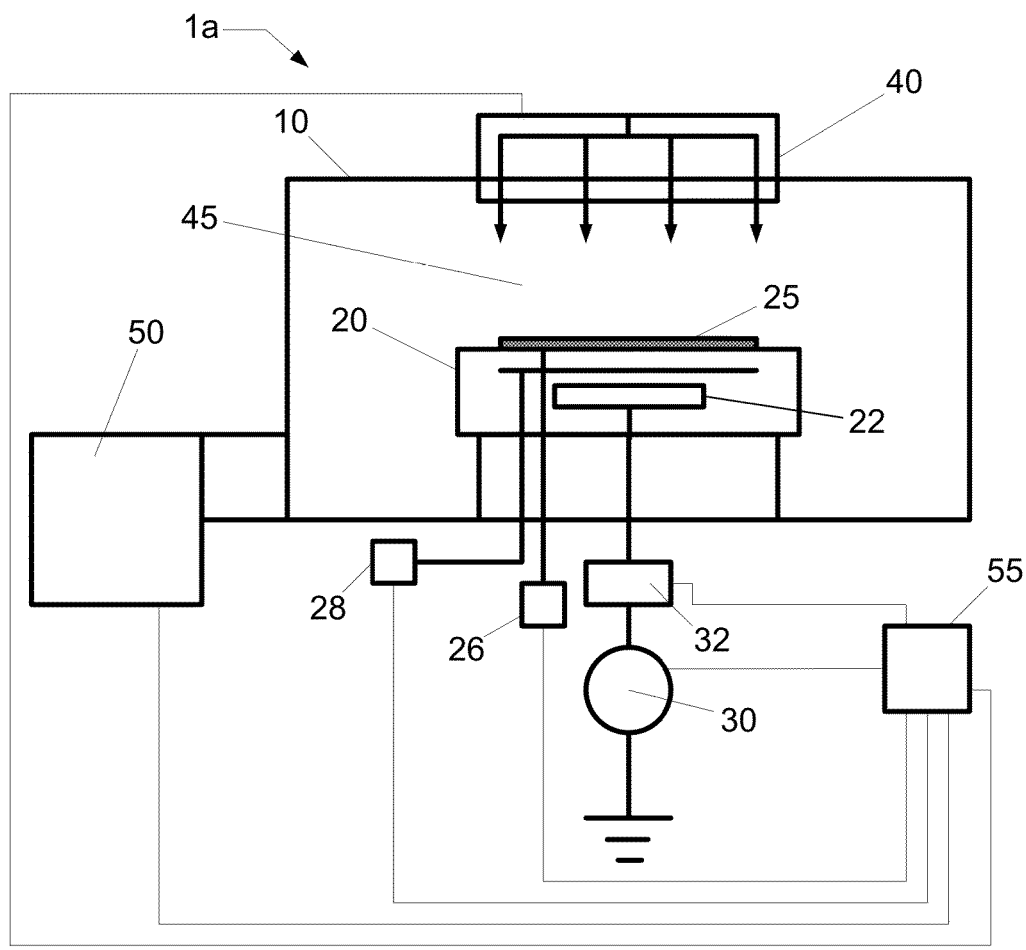
FIG. 5 shows a schematic representation of a plasma etching system according to another embodiment.

According to another embodiment, a plasma etching system 1a configured to perform the above identified process conditions is depicted in FIG. 5 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma etching system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermo-electric heaters/coolers can be included in the substrate holder 20, as well as the chamber wall of the plasma processing chamber 10 and any other component within the plasma etching system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 5, substrate holder 20 can comprise an electrode 22 through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10.

Controller 55 comprises a microprocessor, memory, and a digital I/O port capable of generating control voltages sufficient to communicate and activate inputs to plasma etching system 1a as well as monitor outputs from plasma etching system 1a. Moreover, controller 55 can be coupled to and can exchange information with RF generator 30, impedance match network 32, the gas distribution system 40, vacuum pumping system 50, as well as the substrate heating/cooling system (not shown), the backside gas supply system 26, and/or the electrostatic clamping system 28. For example, a program stored in the memory can be utilized to activate the inputs to the aforementioned components of plasma etching system 1a according to a process recipe in order to perform a plasma assisted process on substrate 25.

Controller 55 can be locally located relative to the plasma etching system 1a, or it can be remotely located relative to the plasma etching system 1a. For example, controller 55 can exchange data with plasma etching system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 6, plasma etching system 1b can be similar to the embodiment of FIG. 5 and further comprise either a stationary, or mechanically or electrically rotating magnetic field system 60, in order to potentially increase plasma density and/or improve plasma processing uniformity, in addition to those components described with reference to FIG. 5. Moreover, controller 55 can be coupled to magnetic field system 60 in order to regulate the speed of rotation and field strength. The design and implementation of a rotating magnetic field is well known to those skilled in the art.

Figure 6:
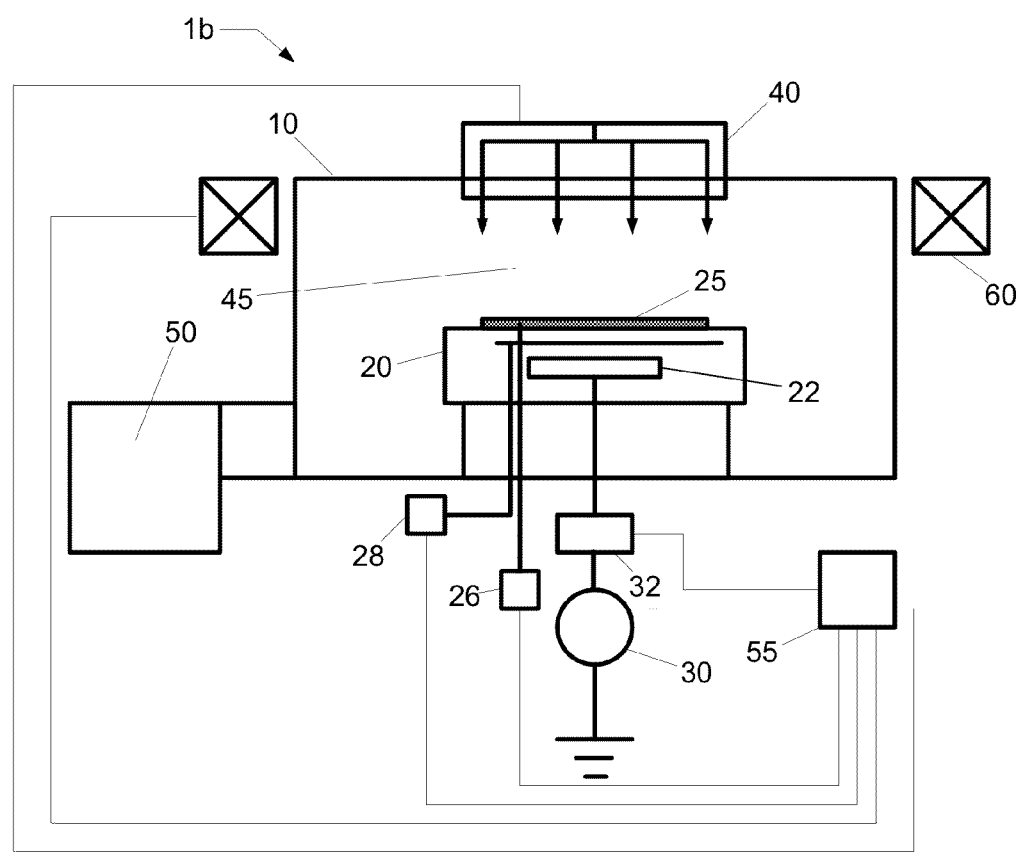
FIG. 6 shows a schematic representation of a plasma etching system according to another embodiment.
Figure 7:
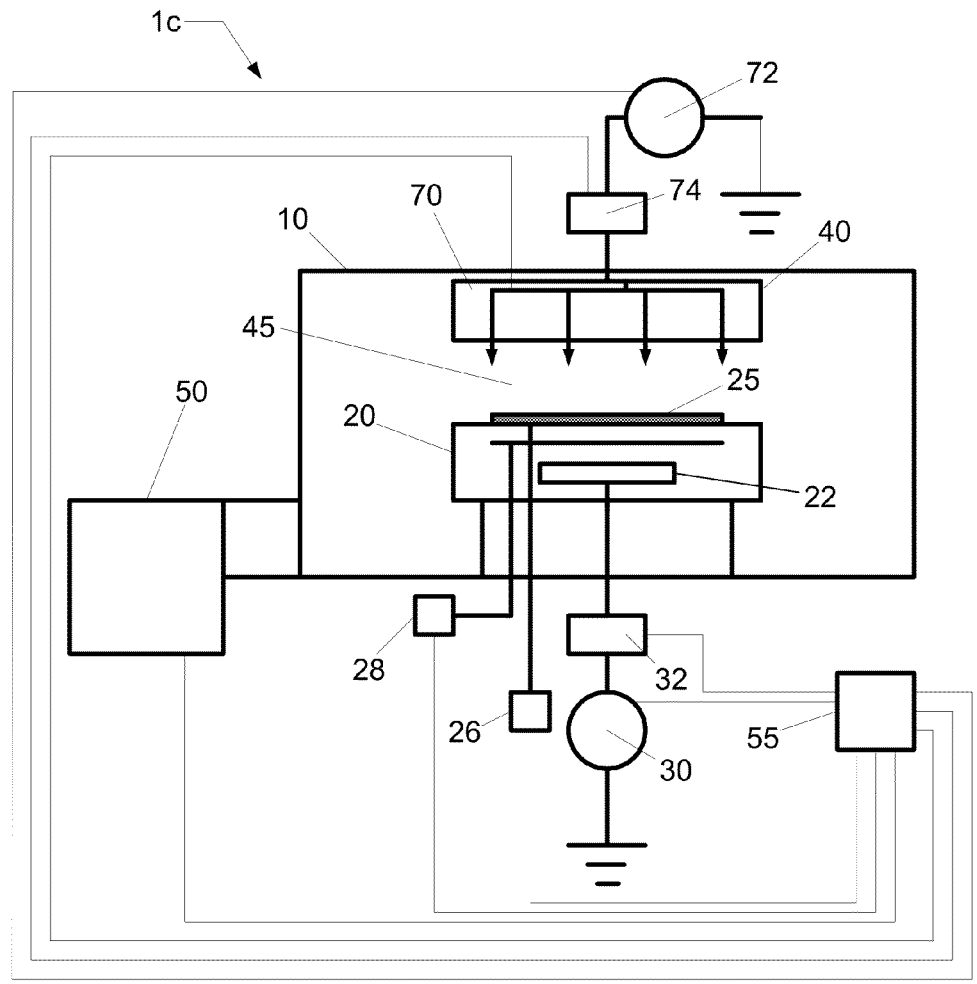
FIG. 7 shows a schematic representation of a plasma etching system according to another embodiment.

In the embodiment shown in FIG. 7, plasma etching system 1c can be similar to the embodiment of FIG. 5 or FIG. 6, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 8:
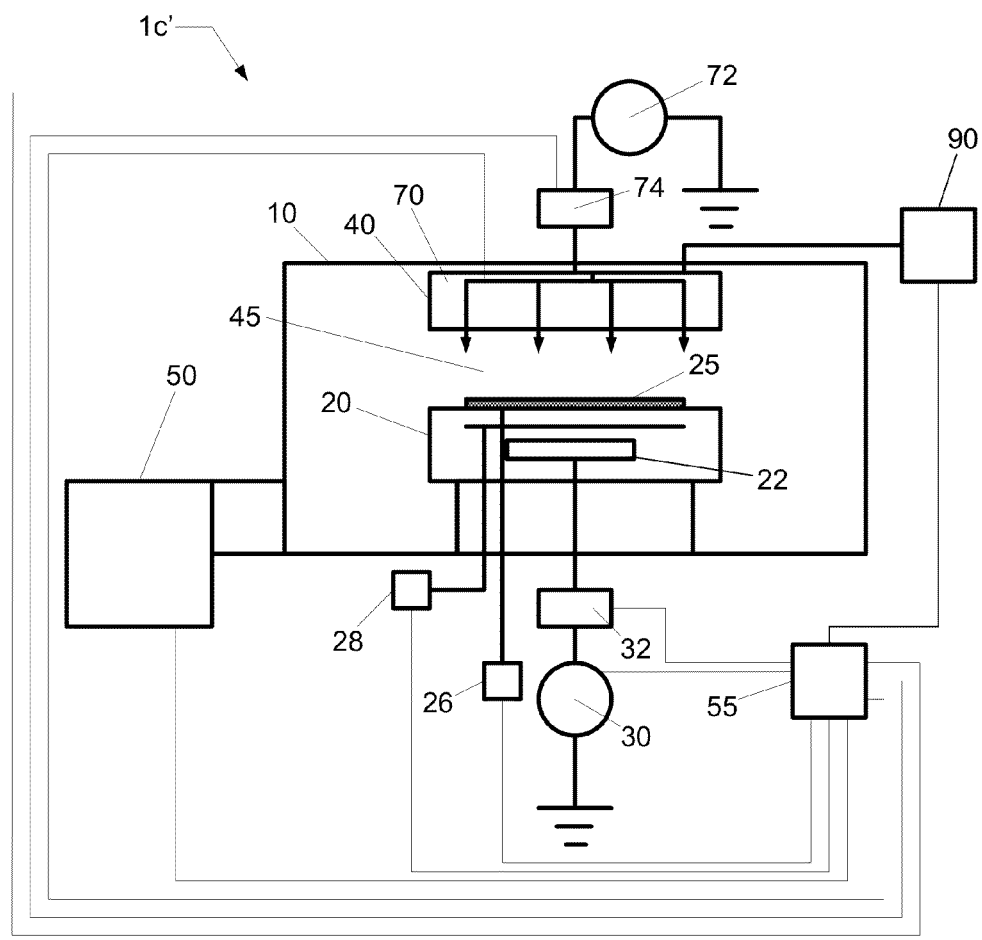
FIG. 8 shows a schematic representation of a plasma etching system according to another embodiment.

In the embodiment shown in FIG. 8, plasma etching system 1c' can be similar to the embodiment of FIG. 7, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring, adjusting, or controlling the polarity, current, voltage, or on/off state of the DC power supply 90. Once plasma is formed, the DC power supply 90 facilitates the formation of a ballistic electron beam. An electrical filter (not shown) may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 9:
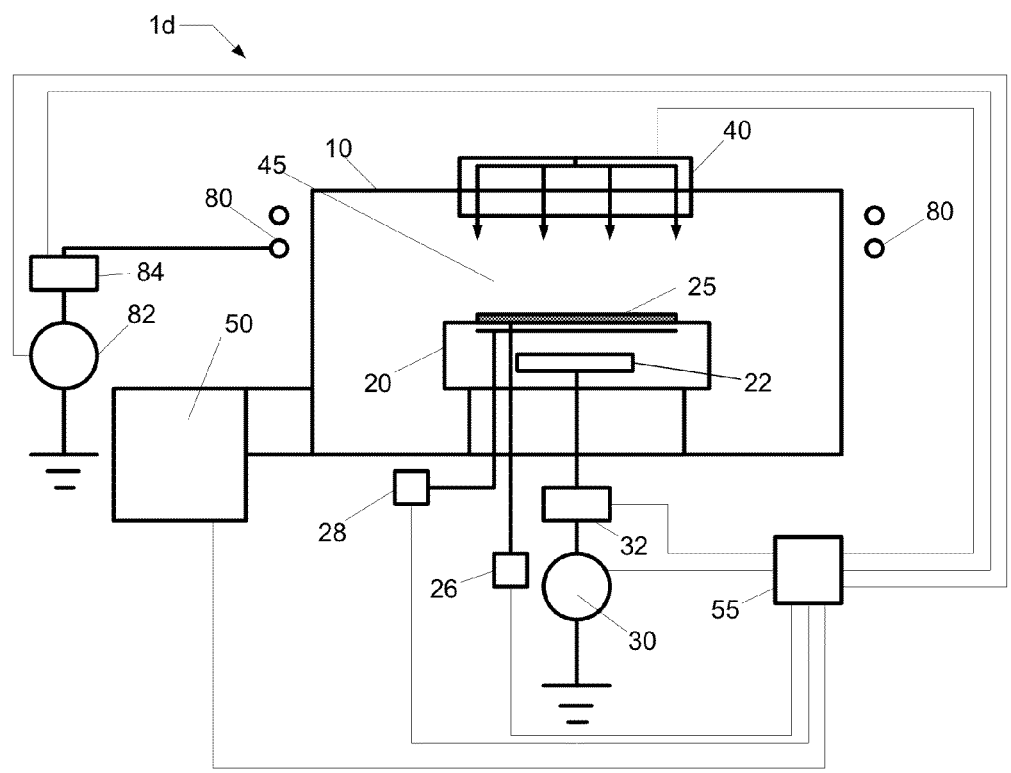
FIG. 9 shows a schematic representation of a plasma etching system according to another embodiment.

In the embodiment shown in FIG. 9, plasma etching system 1d can be similar to the embodiments of FIGS. 5 and 6, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 10:
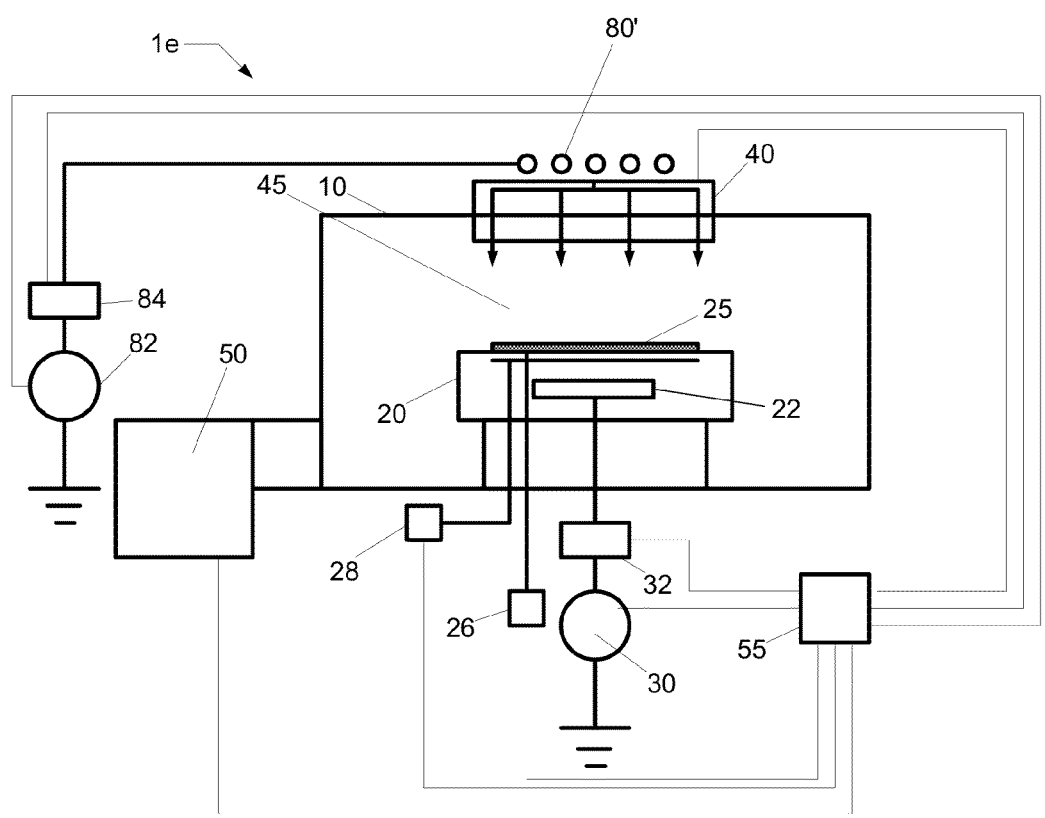
FIG. 10 shows a schematic representation of a plasma etching system according to another embodiment.

In an alternate embodiment, as shown in FIG. 10, plasma etching system 1e can be similar to the embodiment of FIG. 9, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 11:
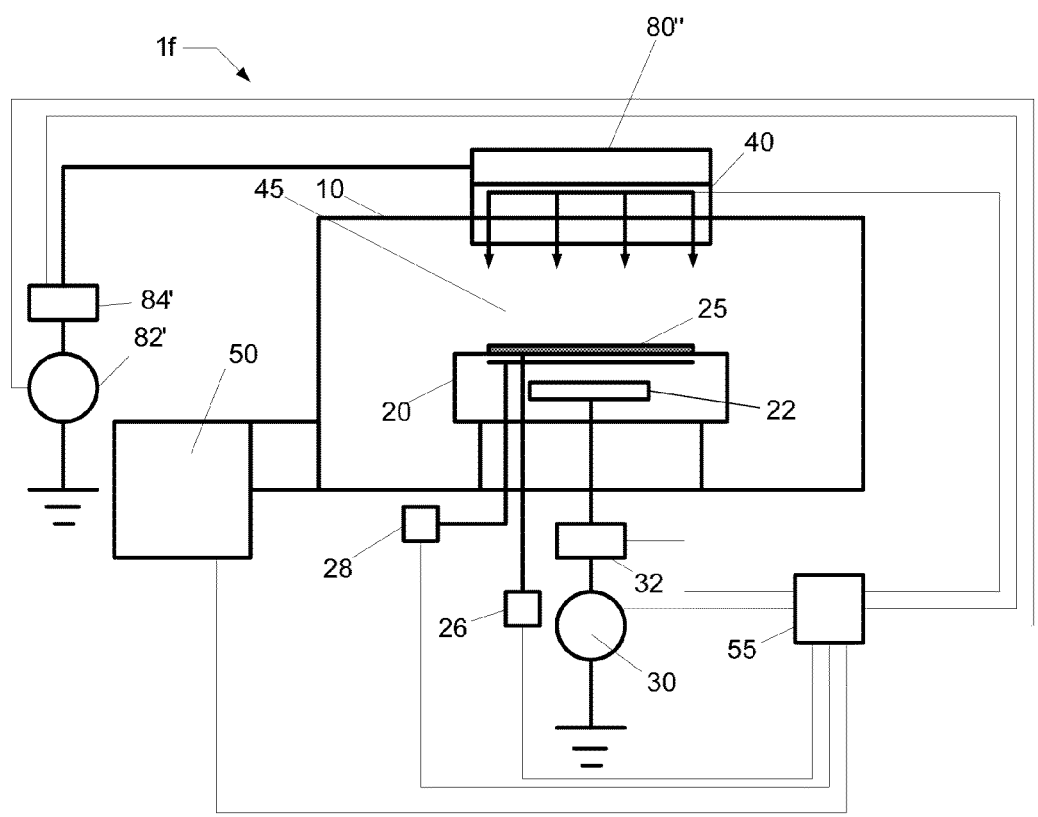
FIG. 11 shows a schematic representation of a plasma etching system according to another embodiment.

In the embodiment shown in FIG. 11, plasma etching system 1f can be similar to the embodiment of FIG. 5, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

Figure 12:
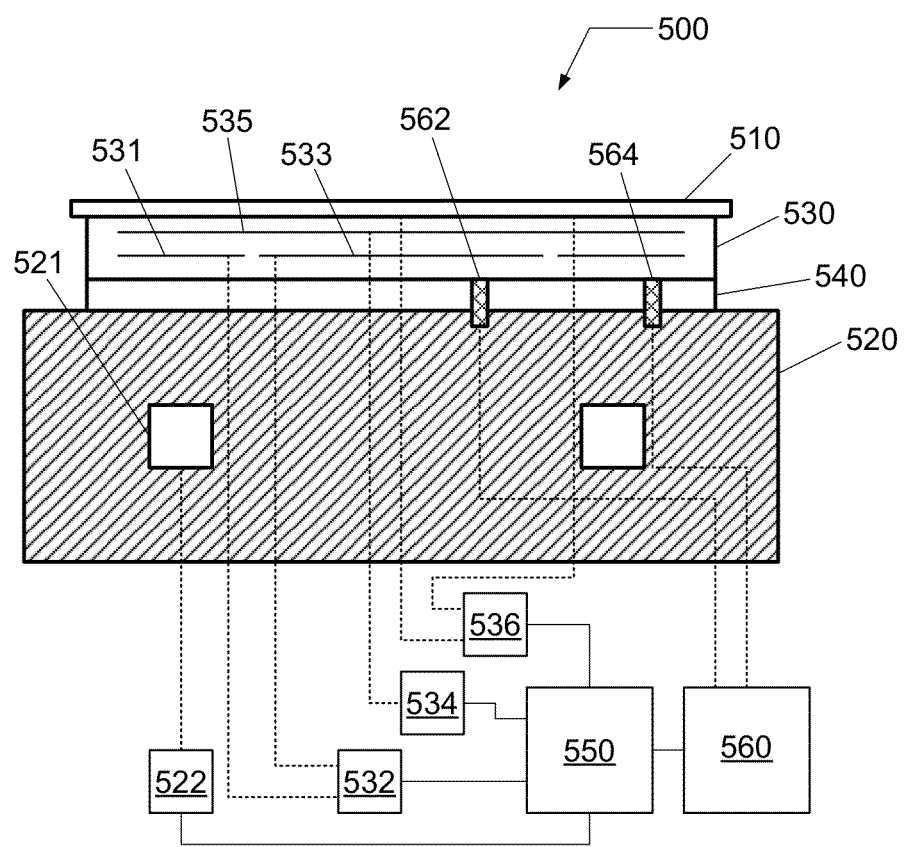
FIG. 12 shows a schematic representation of a substrate holder for use in a plasma etching system according to yet another embodiment.

Referring now to FIG. 12, a temperature controlled substrate holder 500 for use in any one of the plasma etching systems depicted in FIGS. 4 through 11 is described according to yet another embodiment. The substrate holder 500 comprises a substrate support 530 having a first temperature and configured to support a substrate 510, a temperature-controlled support base 520 positioned below substrate support 530 and configured to be at a second temperature less than the first temperature (e.g. less than a desired temperature of substrate 510), and a thermal insulator 540 disposed between the substrate support 530 and the temperature-controlled support base 520. Additionally, the substrate support 530 comprises a center heating element 533 (located at a substantially center region below substrate 510) and an edge heating element 531 (located at a substantially edge, or peripheral, region below substrate 510) coupled thereto, and configured to elevate the temperature of the substrate support 530. Furthermore, the support base 520 comprises one or more cooling elements 521 coupled thereto, and configured to reduce the temperature of the substrate support 530 via the removal of heat from the substrate support 530 through thermal insulator 540.

As shown in FIG. 12, the center heating element 533 and the edge heating element 531 are coupled to a heating element control unit 532. Heating element control unit 532 is configured to provide either dependent or independent control of each heating element, and exchange information with a controller 550. The center heating element 533 and the edge heating element 531 may comprise at least one of a heating fluid channel, a resistive heating element, or a thermo-electric element biased to transfer heat towards the wafer.

For example, the center heating element 533 and the edge heating element 531 may comprise one or more heating channels that can permit flow of a fluid, such as water, FLUORI-NERT, GALDEN HT-135, etc., there through in order to provide conductive-convective heating, wherein the fluid temperature has been elevated via a heat exchanger. The fluid flow rate and fluid temperature can, for example, be set, monitored, adjusted, and controlled by the heating element control unit 532.

Alternatively, for example, the center heating element 533 and the edge heating element 531 may comprise one or more resistive heating elements such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, CT. The Kanthal family includes ferritic alloys (FeCrAl) and the Nikrothal family includes austenitic alloys (NiCr, NiCrFe). For example, the heating elements can comprise a cast-in heater commercially available from Watlow (1310 Kingsland Dr., Batavia, Ill., 60510) capable of a maximum operating temperature of 400 to 450 degrees C., or a film heater comprising aluminum nitride materials that is also commercially available from Watlow and capable of operating temperatures as high as 300 degrees C. and power densities of up to 23.25 W/cm$^2$. Additionally, for example, the heating element can comprise a silicone rubber heater (1.0 mm thick) capable of power of 1400 W (or power density of 5 W/in$^2$). When an electrical current flows through the filament, power is dissipated as heat, and, therefore, the heating element control unit 532 can, for example, comprise a controllable DC power supply. A further heater option, suitable for lower temperatures and power densities, are Kapton heaters, consisting of a filament embedded in a Kapton (e.g. polyimide) sheet, marketed by Minco, Inc., of Minneapolis, Minn.

Alternately, for example, the center heating element 533 and the edge heating element 531 can comprise an array of thermo-electric elements capable of heating or cooling a substrate depending upon the direction of electrical current flow through the respective elements. Thus, while the center heating element 533 and the edge heating element 531 are referred to as "heating elements," these elements may include the capability of cooling in order to provide rapid transition between temperatures. Further, heating and cooling functions may be provided by separate elements within the substrate support 530. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). Therefore, the heating element control unit 532 can, for example, comprise a controllable current source.

The one or more cooling elements 521 can comprise at least one of a cooling channel, or a thermo-electric element. Furthermore, as shown in FIG. 12, the one or more cooling elements 521 are coupled to a cooling element control unit 522. Cooling element control unit 522 is configured to provide dependent or independent control of each cooling element 521, and exchange information with controller 550.

For example, the one or more cooling elements 521 can comprise one or more cooling channels that can permit flow of a fluid, such as water, FLUORINERT, GALDEN HT-135, etc., there through in order to provide conductive-convective cooling, wherein the fluid temperature has been lowered via a heat exchanger. The fluid flow rate and fluid temperature can, for example, be set, monitored, adjusted, and controlled by the cooling element control unit 522. Alternately, during heating for example, the fluid temperature of the fluid flow through the one or more cooling elements 521 may be increased to complement the heating by the center heating element 533 and the edge heating element 531. Alternately yet, during cooling for example, the fluid temperature of the fluid flow through the one or more cooling elements 521 may be decreased.

Alternately, for example, the one or more cooling elements 521 can comprise an array of thermo-electric elements capable of heating or cooling a substrate depending upon the direction of electrical current flow through the respective elements. Thus, while the elements 521 are referred to as "cooling elements," these elements may include the capability of heating in order to provide rapid transition between temperatures. Further, heating and cooling function may be provided by separate elements within the temperature controlled support base 520. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). Therefore, the cooling element control unit 522 can, for example, comprise a controllable current source.

Additionally, as shown in FIG. 12, the substrate holder 500 may further comprise an electrostatic clamp (ESC) comprising one or more clamping electrodes 535 embedded within substrate support 530. The ESC further comprises a high-voltage (HV) DC voltage supply 534 coupled to the clamping electrodes 535 via an electrical connection. The design and implementation of such a clamp is well known to those skilled in the art of electrostatic clamping systems. Furthermore, the HV DC voltage supply 534 is coupled to controller 550 and is configured to exchange information with controller 550.

Furthermore, as shown in FIG. 12, the substrate holder 500 can further comprise a back-side gas supply system 536 for supplying a heat transfer gas, such as an inert gas including helium, argon, xenon, krypton, a process gas, or other gas including oxygen, nitrogen, or hydrogen, to the center region and the edge region of the backside of substrate 510 through two gas supply lines, and at least two of a plurality of orifices and channels (not shown). The backside gas supply system 536, as shown, comprises a two-zone (center/edge) system, wherein the backside pressure can be varied in a radial direction from the center to edge. Furthermore, the backside gas supply system 536 is coupled to controller 550 and is configured to exchange information with controller 550.

Further yet, as shown in FIG. 12, the substrate holder 500 further comprises a center temperature sensor 562 for measuring a temperature at a substantially center region below substrate 510 and an edge temperature sensor 564 for measuring a temperature at a substantially edge region below substrate 510. The center and edge temperature sensors 562, 564 are coupled to a temperature monitoring system 560.

The temperature sensor can include an optical fiber thermometer, an optical pyrometer, a band-edge temperature measurement system as described in U.S. Pat. No. 6,891,124, the contents of which are incorporated herein by reference in their entirety, or a thermocouple (as indicated by the dashed line) such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

The temperature monitoring system 560 may provide sensor information to controller 550 in order to adjust at least one of a heating element, a cooling element, a backside gas supply system, or an HV DC voltage supply for an ESC before, during, or after processing.

Controller 550 includes a microprocessor, memory, and a digital I/O port (potentially including D/A and/or A/D converters) capable of generating control voltages sufficient to communicate and activate inputs to substrate holder 500 as well as monitor outputs from substrate holder 500. As shown in FIG. 12, controller 550 can be coupled to and exchange information with heating element control unit 532, cooling element control unit 522, HV DC voltage supply 534, backside gas supply system 536, and temperature monitoring system 560. A program stored in the memory is utilized to interact with the aforementioned components of substrate holder 500 according to a stored process recipe.

The controller 550 may also be implemented as a general purpose computer, processor, digital signal processor, etc., which causes a substrate holder to perform a portion or all of the processing steps of the invention in response to the controller 550 executing one or more sequences of one or more instructions contained in a computer readable medium. The computer readable medium or memory is configured to hold instructions programmed according to the teachings of the invention and can contain data structures, tables, records, or other data described herein. Examples of computer readable media are hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Controller 550 may be locally located relative to the substrate holder 500, or it may be remotely located relative to the substrate holder 500 via an internet or intranet. Thus, controller 550 can exchange data with the substrate holder 500 using at least one of a direct connection, an intranet, or the Internet. Controller 550 may be coupled to an intranet at a customer site (i.e., a device maker, etc.), or coupled to an intranet at a vendor site (i.e., an equipment manufacturer). Furthermore, another computer (i.e., controller, server, etc.) can access controller 550 to exchange data via at least one of a direct connection, an intranet, or the Internet.

Optionally, substrate holder 500 can include an electrode through which RF power is coupled to plasma in a processing region above substrate 510. For example, support base 520 can be electrically biased at an RF voltage via the transmission of RF power from an RF generator through an impedance match network to substrate holder 500. The RF bias can serve to heat electrons to form and maintain plasma, or bias substrate 510 in order to control ion energy incident on substrate 510, or both. In this configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, an impedance match network can serve to maximize the transfer of RF power to plasma in the processing chamber by minimizing the reflected power. Various match network topologies (e.g., L-type, π-type, T-type, etc.) and automatic control methods can be utilized.

Additional details for the design of a temperature controlled substrate holder configured for rapid and uniform control of substrate temperature are provided in U.S. Patent Application Publication No. 2008/0083723; U.S. Patent Application Publication No. 2010/0078424; U.S. Patent Application Publication No. 2008/0083724; U.S. Patent Application Publication No. 2008/0073335; U.S. Pat. No. 7,297,894; U.S. Pat. No. 7,557,328; and U.S. Patent Application Publication No. 2009/0266809.

In one embodiment, the plasma etch process may comprise a process parameter space that includes: a chamber pressure ranging up to about 1000 mTorr (milli-Torr) (e.g., up to about 200 mTorr, or ranging from about 10 mTorr to about 80 mTorr, or about 30 mTorr to about 60 mTorr), a process gas flow rate ranging up to about 2000 sccm (standard cubic centimeters per minute) (e.g., up to about 1000 sccm, or ranging from about 1 sccm to about 100 sccm, or about 1 sccm to about 50 sccm, or about 10 sccm to about 50 sccm), a non-oxygen-containing additive gas flow rate ranging up to about 2000 sccm (e.g., up to about 1000 sccm, or ranging from about 1 sccm to about 150 sccm, or about 80 sccm to about 120 sccm, or about 5 sccm to about 20 sccm), an upper electrode (e.g., element 70 in FIG. 7) RF bias ranging up to about 2000 W (watts) (e.g., up to about 1000 W, or up to about 500 W), and a lower electrode (e.g., element 22 in FIG. 6) RF bias ranging up to about 1000 W (e.g., up to about 500 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

Other gases may be added including an oxygen-containing gas, such as $O_2$, and/or a noble gas (He, Ne, Ar, Kr, Xe). The oxygen-containing gas flow rate may range up to about 2000 sccm (standard cubic centimeters per minute) (e.g., up to about 1000 sccm, or ranging from about 1 sccm to about 100 sccm, or about 1 sccm to about 50 sccm, or about 10 sccm to about 40 sccm), and the noble gas flow rate may range up to about 2000 sccm (e.g., up to about 1000 sccm, or ranging from about 100 sccm to about 1000 sccm, or about 200 sccm to about 800 sccm).

In another alternate embodiment, RF power is supplied to the upper electrode and not the lower electrode. In another alternate embodiment, RF power is supplied to the lower electrode and not the upper electrode. In alternate embodiments. RF power and/or DC power may be coupled in any of the manners described in FIGS. 4 through 11.

The time duration to perform a plasma etch process may be determined using design of experiment (DOE) techniques or prior experience; however, it may also be determined using endpoint detection. One possible method of endpoint detection is to monitor a portion of the emitted light spectrum from the plasma region that indicates when a change in plasma chemistry occurs due to change or substantially near completion of the removal of a particular material layer from the substrate and contact with the underlying thin film. After emission levels corresponding to the monitored wavelengths cross a specified threshold (e.g., drop to substantially zero, drop below a particular level, or increase above a particular level), an endpoint can be considered to be reached. Various wavelengths, specific to the etch chemistry being used and the material layer being etched, may be used. Furthermore, the etch time can be extended to include a period of over-etch, wherein the over-etch period constitutes a fraction (i.e., 1 to 100%) of the time between initiation of the etch process and the time associated with endpoint detection.

The plasma etch process described above may be performed utilizing a plasma etching system such as the one described in FIGS. 4 through 11. Furthermore, the plasma etch process described above may be performed utilizing a temperature controlled substrate holder in a plasma etching system such as the one described in FIG. 12. However, the methods discussed are not to be limited in scope by this exemplary presentation.

As noted above, the present inventors discovered that using a balance of process gas containing C, H and F, and a non-oxygen-containing additive gas may achieve an anisotropic etch profile with a reduced recess in a silicon-containing contact region, wherein the non-oxygen-containing additive gas includes H, or C, or both H and C, and excludes a halogen atom. The process gas may be oxygen-free.

As illustrated in FIG. 3, substrate 300 including silicon nitride layer 320 is subject to a plasma etching process to expose a silicon-containing contact region 343 while reducing recess 342. Table 1 provides five exemplary process conditions (i.e., "Baseline", "A", "B", "C", "D") for patterning the silicon nitride layer 320, and performance metrics are recited for landing on a silicon layer (Si) and a silicon oxide ($SiO_2$) layer.

TABLE 1

| Process | UEL RF (W) | LEL RF (W) | p (mTorr) | T (° C.) (LEL-C, LEL-E) | He Pressure (Torr) (LEL-C, LEL-E) | CH$_3$F (sccm) | O$_2$ (sccm) |
|---|---|---|---|---|---|---|---|
| Baseline | <2000 | <1000 | 10-80 | 20, 20 | 40, 15 | 1-50 | 1-50 |
| A | <2000 | <1000 | 10-80 | 20, 20 | 40, 30 | 1-50 | X |
| B | <2000 | <1000 | 10-80 | 20, 20 | 40, 15 | 1-50 | 1-50 |
| C | <2000 | <1000 | 10-80 | 20, 20 | 40, 15 | 1-50 | 1-50 |
| D | <2000 | <1000 | 10-80 | 20, 20 | 40, 15 | 1-50 | 1-50 |

| Process | Ar (sccm) | H$_2$ (sccm) | C$_2$H$_4$ (sccm) | Etch time (sec) | SiN Profile | Recess SiO$_2$ (nm) | Recess Si (nm) | Selectivity SiN/SiO$_2$ | Selectivity SiN/Si |
|---|---|---|---|---|---|---|---|---|---|
| Baseline | <1000 | X | X | 45 | Bowed | 10 | 6.5 | 5.8 | 8.9 |
| A | <1000 | 80-120 | X | 45 | Vertical | 5 | 1 | 8.5 | 42.7 |
| B | <1000 | X | X | 45 | Slight taper | 3 | 3 | 16.5 | 16.5 |
| C | <1000 | X | X | 45 | Taper | 1 | 3 | 19.0 | 6.3 |
| D | <1000 | X | 5-20 | 45 | Slight taper | 1 | 1 | 24.1 | 24.1 |

For each plasma etching process, a process condition is recited including a process (name), an upper electrode (UEL) power (watts, W), a lower electrode (LEL) power (watts, W), a gas pressure (milli-Torr, mTorr) in the plasma etching system, a temperature set for components in the plasma etching system (° C.) ("LEL"=Lower electrode temperature, i.e., substrate temperature, at the center "LEL-C" and edge "LEL-E"), a backside helium (He) pressure (Torr), a CH$_3$F flow rate (range of flow rate in standard cubic centimeters per minute, sccm), an O$_2$ flow rate (range of flow rate in sccm), an Ar flow rate (range of flow rate in sccm), an H$_2$ flow rate (range of flow rate in sccm), a C$_2$H$_4$ flow rate (range of flow rate in sccm), and etch time (sec, seconds) ("X" indicates exclusion of a specific gas).

Figure 13:
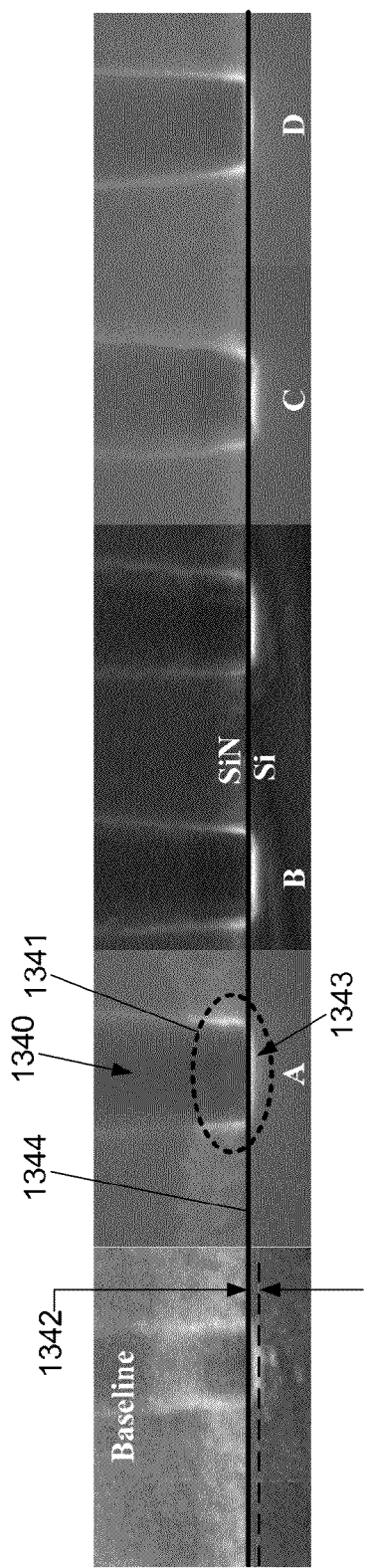
FIG. 13 provides a SEM photograph of a patterning result using a plasma etching process.

FIG. 13 provides SEM (scanning electron microscope) photographs of a feature bottom 1341 for a contact via 1340 at an interface 1344 between a patterned silicon nitride layer ("SiN", or more generally SiN$_x$) and a silicon layer ("Si"). The SEM photographs are arranged side-by-side for each of the five process conditions recited in Table 1 (i.e., "Baseline", "A", "B", "C", "D"). Table 1 provides a description of the silicon nitride (SiN) profile for the SEM photographs, the depth of recess 1342 for SiN overlying SiO$_2$, and SiN overlying Si, and the etch selectivity for SiN overlying SiO$_2$, (i.e., "SiN/SiO$_2$"=SiN etch rate/SiO$_2$ etch rate) and SiN overlying Si (i.e., "SiN/Si"=SiN etch rate/Si etch rate).

As evident in Table 1 and FIG. 13, the addition of H$_2$ to CH$_3$F produces a high etch selectivity between SiN and Si in excess of 40:1, and a marginal etch selectivity between SiN and SiO$_2$ in excess of 8:1. Additionally, the recess 1342 of bottom surface 1343 for feature bottom 1341 at interface 1344 between SiN and Si is exceptional, i.e., about 1 nm or less. Further, the side wall profile is vertical. When an oxygen-free process with high selectivity between SiN$_x$ and Si is desirable, a process composition containing CH$_3$F and H$_2$ may be used.

As evident in Table 1 and FIG. 13, the addition of C$_2$H$_4$ to CH$_3$F produces a high etch selectivity between SiN and Si in excess of 20:1, and a high etch selectivity between SiN and SiO$_2$ in excess of 20:1. Additionally, the recess 1342 at the interface 1344 between SiN and Si is exceptional, i.e., about 1 nm or less. Additionally yet, the recess 1342 at the interface 1344 between SiN and SiO$_2$ is also exceptional, i.e., about 1 nm or less. Further, the side wall profile is acceptable with a slight taper. When selectivity between SiN$_x$ and Si, as well as between SiN$_x$ and SiO$_y$, are desirable, a process composition containing CH$_3$F, C$_2$H$_4$, and O$_2$ may be used.

Although only certain embodiments of this invention have been described in detail above, those skilled in the art will readily appreciate that many modifications are possible in the embodiments without materially departing from the novel teachings and advantages of this invention. For example, although one exemplary process flow is provided for preparing a gate structure, other process flows are contemplated. Accordingly, all such modifications are intended to be included within the scope of this invention.

The invention claimed is:

1. A method for selectively etching a substrate, comprising:
preparing a substrate comprising a silicon nitride layer overlying a silicon-containing contact region;
patterning said silicon nitride layer to expose said silicon-containing contact region using a plasma etching process in a plasma etching system, wherein said plasma etching process uses a process composition consisting of, as incipient ingredients, CH$_3$F, C$_2$H$_4$ as a halogen-free additive gas, O$_2$ and an optional noble gas; and
optimizing said plasma etching process to achieve an etch selectivity between said silicon nitride layer and said silicon-containing contact region that exceeds 20:1.

2. The method of claim 1, further comprising:
preparing said substrate with a silicon oxide layer; and
optimizing said plasma etching process to achieve an etch selectivity between said silicon nitride layer and said silicon oxide layer that exceeds 20:1.

3. The method of claim 2, wherein a flow rate of said CH$_3$F gas ranges from about 1 sccm to about 50 sccm, a flow rate of said C$_2$H$_4$ gas ranges from about 5 sccm to about 20 sccm; and a flow rate of said O$_2$ gas ranges from about 1 sccm to about 50 sccm.

4. The method of claim 1, wherein said plasma etching process includes setting a pressure in said plasma etching system ranging from 10 mTorr to 80 mTorr.

5. The method of claim 1, wherein said plasma etching process includes coupling first radio frequency (RF) power at a first frequency to a substrate holder upon which said substrate rests in said plasma etching system, and coupling second radio frequency (RF) power at a second frequency to an upper electrode opposing said substrate on said substrate holder.

6. The method of claim 1, wherein said substrate rests on a temperature controlled substrate holder in said plasma etching system, said temperature controlled substrate holder comprises:
- a support base having fluid channels to circulate a temperature controlled thermal fluid in said support base; and
- a substrate support coupled via a thermal insulator to an upper portion of said support base, said substrate support comprising:
  - one or more heating elements embedded within said substrate support,
  - an upper surface to support said substrate by contact between said upper surface and a backside of said substrate, and
  - an electrostatic clamp electrode to hold said substrate on said upper surface of said substrate support.

7. The method of claim 6, wherein said temperature controlled substrate holder further comprises:
- a backside gas supply system configured to supply a heat transfer gas to the backside of said substrate through at least one of a plurality of orifices or channels disposed on said upper surface of said substrate support, wherein said plurality of orifices of said backside gas supply system are arranged in a plurality of zones on said upper surface of said substrate support to vary a backside pressure in a radial direction between a substantially central region of the backside of said substrate and a substantially edge region of the backside of said substrate.

8. The method of claim 1, wherein said silicon-containing contact region comprises a source region or drain region for a transistor.

9. The method of claim 1, wherein said silicon-containing contact region comprises doped silicon or metal silicide.

* * * * *

UNITED STATES PATENT AND TRADEMARK OFFICE
CERTIFICATE OF CORRECTION

| | | |
|---|---|---|
| PATENT NO. | : 8,501,630 B2 | Page 1 of 1 |
| APPLICATION NO. | : 12/892912 | |
| DATED | : August 6, 2013 | |
| INVENTOR(S) | : Andrew W. Metz et al. | |

It is certified that error appears in the above-identified patent and that said Letters Patent is hereby corrected as shown below:

In the Specification

In Col. 10, line 14, "if can be similar" should bread --1$f$ can be similar--.

Signed and Sealed this
Sixth Day of May, 2014

Michelle K. Lee
*Deputy Director of the United States Patent and Trademark Office*